United States Patent
Mann et al.

(10) Patent No.: US 12,155,157 B2
(45) Date of Patent: Nov. 26, 2024

(54) OPTIMIZING MOUNTING POINTS FOR COAXIAL RF CONNECTORS

(71) Applicant: INTERNATIONAL BUSINESS MACHINES CORPORATION, Armonk, NY (US)

(72) Inventors: Phillip V. Mann, Rochester, MN (US); Brandon R. Christenson, Kasson, MN (US); Ray Clement Laning, Paynesville, MN (US); George Russell Zettles, IV, Rochester, MN (US); Pat Rosno, Rochester, MN (US); Layne A. Berge, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 246 days.

(21) Appl. No.: 17/708,632

(22) Filed: Mar. 30, 2022

(65) Prior Publication Data
US 2023/0318235 A1    Oct. 5, 2023

(51) Int. Cl.
*H01R 13/6595* (2011.01)
*H01R 12/70* (2011.01)
*H01R 13/207* (2006.01)

(52) U.S. Cl.
CPC ..... *H01R 13/6595* (2013.01); *H01R 12/7082* (2013.01); *H01R 13/207* (2013.01)

(58) Field of Classification Search
CPC ............ H01R 13/6595; H01R 12/7082; H01R 13/207; H01R 24/50; H05K 9/0018; H05K 9/006
See application file for complete search history.

(56) References Cited

U.S. PATENT DOCUMENTS

| | | | |
|---|---|---|---|
| 4,202,594 A | 5/1980 | Coleman et al. | |
| 5,641,294 A | 6/1997 | Beard | |
| 5,679,006 A | 10/1997 | Madelaine | |
| 5,897,384 A * | 4/1999 | Hosler, Sr. | H01R 24/50 |
| | | | 439/63 |
| 6,357,932 B1 | 3/2002 | Auld | |
| 6,866,544 B1 | 3/2005 | Casey et al. | |
| 7,064,265 B2 | 6/2006 | Cochrane | |
| 8,390,993 B1 | 3/2013 | Wilson et al. | |
| 8,568,149 B1 * | 10/2013 | Vackar | H01R 25/006 |
| | | | 439/63 |
| 2009/0080849 A1 | 3/2009 | Hankins et al. | |

(Continued)

FOREIGN PATENT DOCUMENTS

WO    2008008693 A2    1/2008

OTHER PUBLICATIONS

International Search Report and Written Opinion, PCT/IB2023/052906, Sep. 22, 2023, 19 pages.

(Continued)

*Primary Examiner* — Travis S Chambers
(74) *Attorney, Agent, or Firm* — Stosch Sabo (57) ABSTRACT

Systems for optimizing mounting points for coaxial RF connectors, including a printed circuit board (PCB) comprising a coaxial radio frequency (RF) connector; a faceplate comprising an opening adapted to receive the coaxial RF connector; and a bushing positioned within the opening, wherein the coaxial RF connector is positioned within the bushing.

14 Claims, 7 Drawing Sheets

(56) References Cited

U.S. PATENT DOCUMENTS

| | | | |
|---|---|---|---|
| 2009/0197434 A1 | 8/2009 | Kressner et al. | |
| 2009/0197469 A1 | 8/2009 | Huang et al. | |
| 2011/0021042 A1* | 1/2011 | Weidner | H01R 24/50 |
| | | | 439/63 |
| 2014/0273648 A1* | 9/2014 | Baumler | H01R 31/06 |
| | | | 439/638 |
| 2017/0331230 A1* | 11/2017 | Bayer | H01R 13/629 |

OTHER PUBLICATIONS

Gruchalla et al., Managing Electromagnetic Interference in Large Instrumentation Systems, Proceedings of IBIC2014, General Diagnostics, URL: https://accelconf.web.cern.ch/IBIC2014/papers/tutub1.pdf, ISBN 978-3-95459-141-0, dated 2014, printed Aug. 25, 2021, 15 pages.

* cited by examiner

OPTIMIZING MOUNTING POINTS FOR COAXIAL RF CONNECTORS

BACKGROUND

Field of the Disclosure

The field of the disclosure is data processing, or, more specifically, methods, apparatus, and products for optimizing mounting points for coaxial RF connectors.

Description of Related Art

Coaxial RF (radio frequency) connectors are electrical connectors for coaxial cables and are designed to transmit radio frequency signals while maintaining the shielding properties that coaxial cables provide. There are multiple types of coaxial RF connectors, and such connectors are often fragile and susceptible to noise and EMI (Electromagnetic Interference).

SUMMARY

Apparatus and systems for optimizing mounting points for coaxial RF connectors according to various embodiments are disclosed in this specification. An embodiment in accordance with the present disclosure is directed to an apparatus for optimizing mounting points for coaxial RF connectors, where the apparatus may include: a printed circuit board (PCB) comprising a coaxial radio frequency (RF) connector; a faceplate comprising an opening adapted to receive the coaxial RF connector; and a bushing positioned within the opening, wherein the coaxial RF connector is positioned within the bushing.

Another embodiment in accordance with the present disclosure is directed to an apparatus for optimizing mounting points for coaxial RF connectors, where the apparatus may include: a mounting bracket comprising a plurality of openings, wherein the mounting bracket is configured to couple a plurality of coaxial RF connectors to a PCB; and a plate positioned over the mounting bracket and configured to cover a portion of each of the plurality of coaxial RF connectors.

Another embodiment in accordance with the present disclosure is directed to a system for optimizing mounting points for coaxial RF connectors, where the system may include: a PCB; a plurality of coaxial RF connectors coupled to the PCB with a mounting bracket, wherein the mounting bracket comprises a first face comprising a plurality of openings configured to couple to the plurality of coaxial RF connectors; and a plate positioned over the mounting bracket and covering a portion of each of the plurality of coaxial RF connectors.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
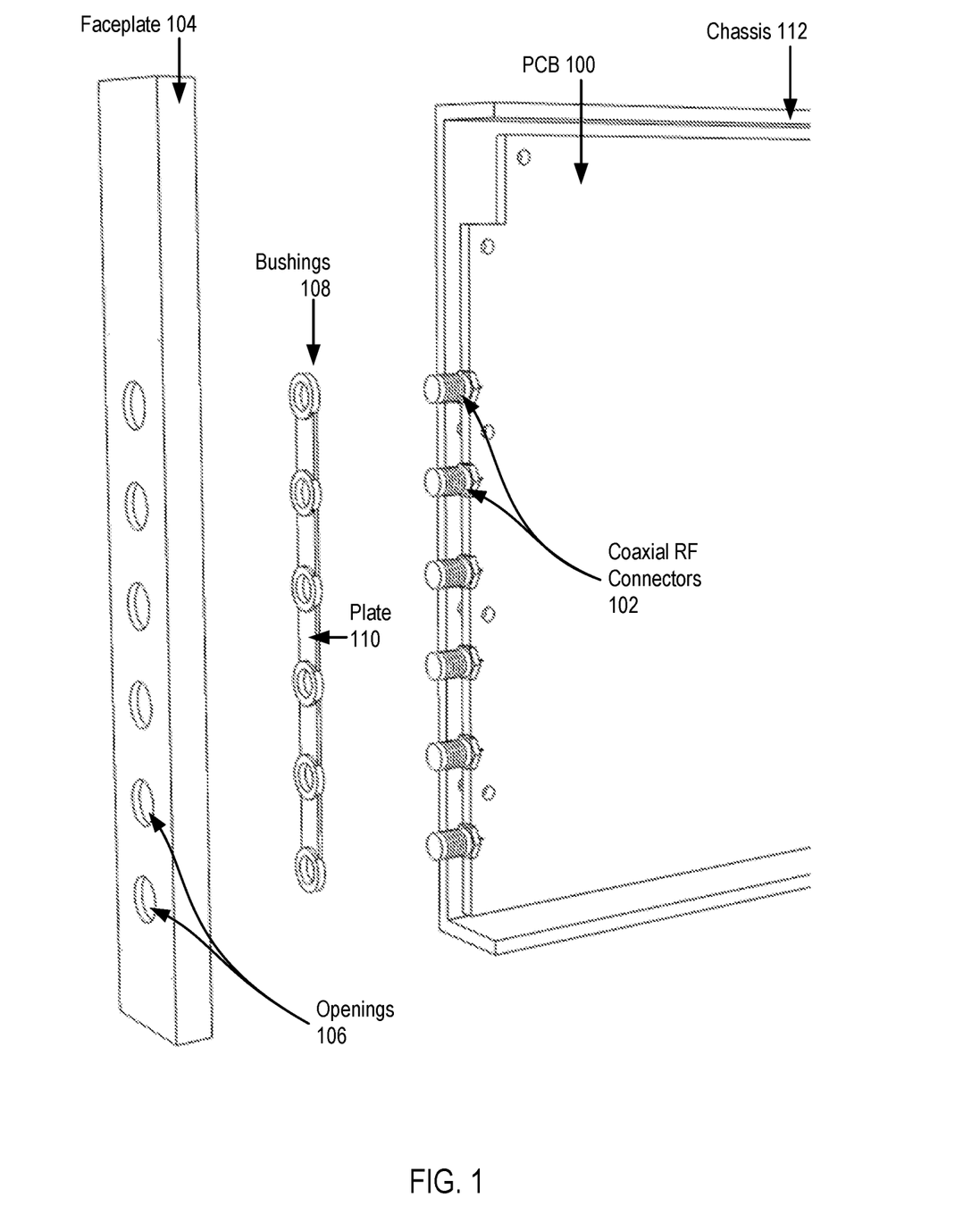
FIG. 1 shows an example line drawing of an apparatus for optimizing mounting points for coaxial RF connectors, where the apparatus is shown in an exploded view.

Exemplary apparatus and systems for optimizing mounting points for coaxial RF connectors in accordance with the present disclosure are described with reference to the accompanying drawings, beginning with FIG. 1. FIG. 1 sets forth a line drawing of an example system configured for optimizing mounting points for coaxial RF connectors according to embodiments of the present disclosure. The system of FIG. 1 includes a PCB (Printed Circuit Board) 100, coaxial RF (Radio Frequency) connectors 102, bushings 108, and a faceplate 104. The example PCB of FIG. 1 may be coupled to or mounted within a chassis 112 and may include one or more coaxial RF connectors 102 coupled to the PCB. The example system of FIG. 1 is shown in an exploded view, with each of the coaxial RF connectors 102, bushings 108, and faceplate 104 shown as separate from one another for explanation.

The example coaxial RF connectors 102 of FIG. 1 may be a connector interface for a coaxial cable with a threaded coupling mechanism and may be configured to transmit radio frequency signals while maintaining the shielding properties that coaxial cables provide. The example coaxial RF connectors 102 of FIG. 1 may be SMA (SubMiniature version A) connectors. Those skilled in the art will understand that coaxial RF connectors are fragile and sensitive to noise and EMI (Electromagnetic Interference). The exterior of the coaxial RF connectors 102 may be composed of metal and may include a threaded portion operable to receive a coaxial cable. The example coaxial RF connectors 102 of FIG. 1 may be mounted to the PCB and electrically coupled to the PCB and electrical components of the PCB, and may be configured to transmit signals between the PCB and a coaxial cable (not shown in FIG. 1).

Figure 3:
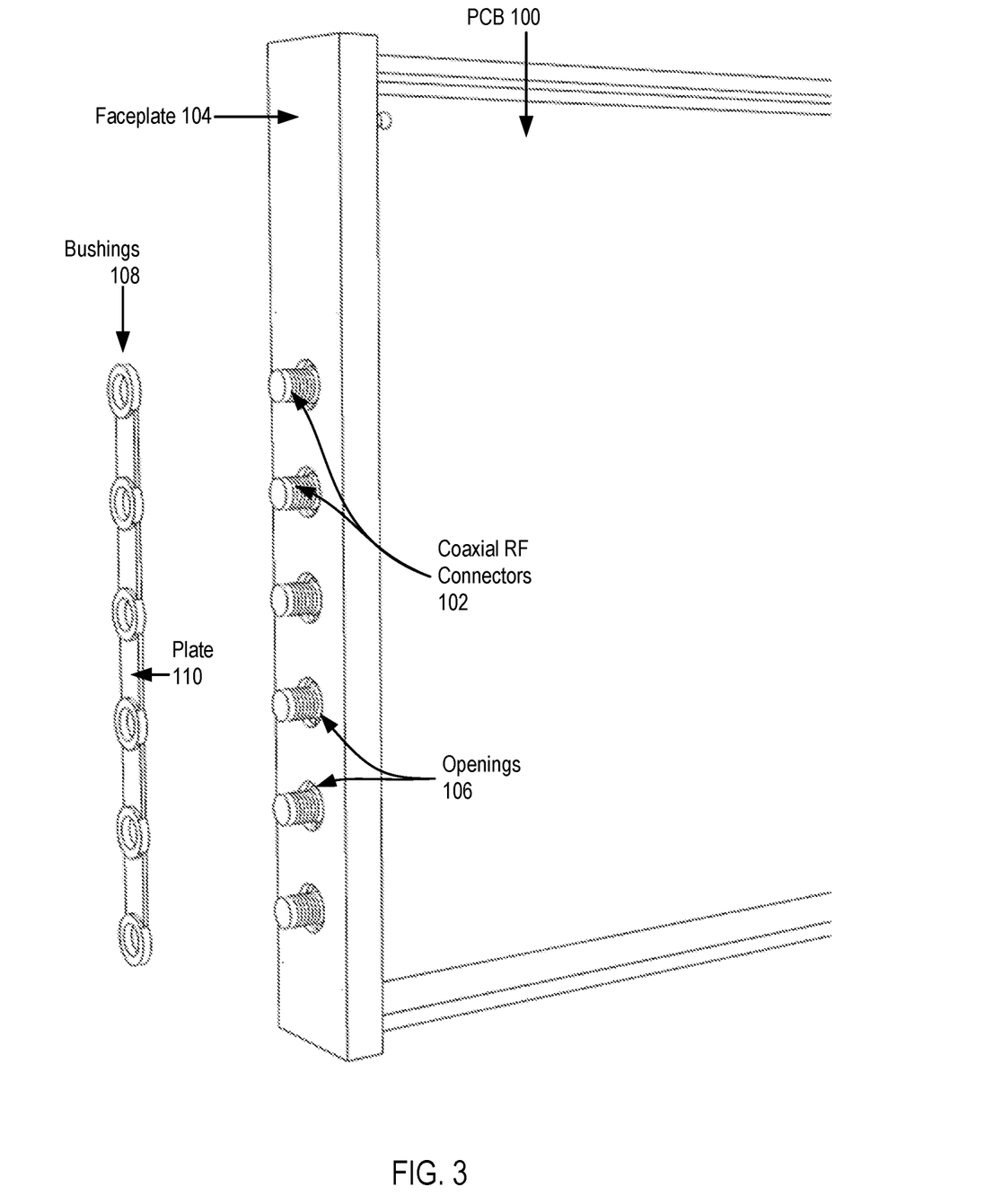
FIG. 3 shows an example line drawing of an apparatus for optimizing mounting points for coaxial RF connectors, where the apparatus is shown in a partially exploded view.

The example faceplate 104 of FIG. 1 includes openings 106 and may be configured to mount to the PCB with the coaxial RF connectors 102 positioned within the openings 106 of the faceplate 104. The faceplate 104 may mount directly to the PCB, directly to the chassis 112, or to both the PCB and the chassis. The faceplate 104, when mounted to the PCB (as shown in FIG. 3), is configured to cover the front portion of the PCB and chassis. The example faceplate 104 of FIG. 1 may be composed of a metal material. The faceplate may include ventilation holes (not shown in FIG. 1) configured to allow for airflow between the faceplate and PCB.

The example bushings 108 of FIG. 1 may be configured to mount to the coaxial RF connectors 102 with the coaxial RF connectors positioned within the bushings 108. The example bushings 108 of FIG. 1 may be composed of a polymer material. The example bushings 108 may be separate and individual bushings or may be coupled together by a plate 110 as shown in FIG. 1. The example system of FIG. 1 may be part of a quantum computing system.

Figure 2:
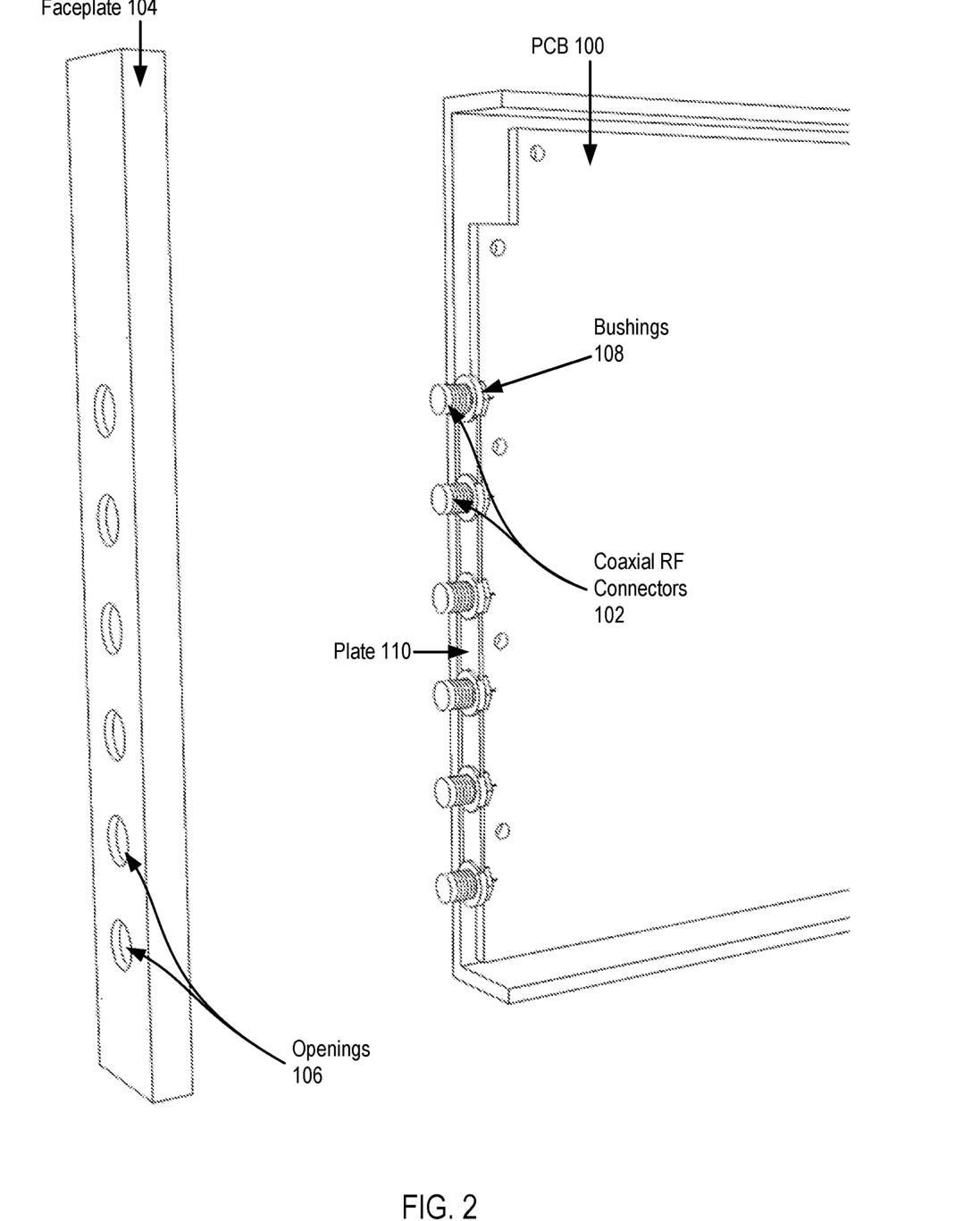
FIG. 2 shows an example line drawing of an apparatus for optimizing mounting points for coaxial RF connectors, where the apparatus is shown in a partially exploded view.

For further explanation, FIG. 2 sets forth a line drawing of the example system of FIG. 1 configured for optimizing mounting points for coaxial RF connectors according to embodiments of the present disclosure but differs from FIG. 1 in that the line drawing of FIG. 2 shows the example system in only a partially exploded view. The example system of FIG. 2 shows the bushings 108 mounted to the PCB 100 with the coaxial RF connectors 102 positioned within the bushings 108. In the partially exploded view of the example system of FIG. 2, the faceplate 104 is shown as being separate from the bushings and coaxial RF connectors 102 for explanation.

As shown in FIG. 2, when the bushings 108 are mounted to the coaxial RF connectors 102, the exterior surfaces of the coaxial RF connectors are in contact with the interior surface of the bushings 108. The inner diameter of the bushings may be equal to the outer diameter of the coaxial RF connectors. The bushings, when mounted, may be configured to provide increased rigidity to the coaxial RF connectors and help to stabilize the coaxial RF connectors from exterior forces.

For further explanation, FIG. 3 sets forth a line drawing of the example system of FIG. 1 configured for optimizing mounting points for coaxial RF connectors according to embodiments of the present disclosure but differs from FIG. 1 in that the line drawing of FIG. 3 shows the example system in only a partially exploded view. The example system of FIG. 3 shows the faceplate 104 mounted to the PCB 100 with the coaxial RF connectors 102 positioned within the openings 106 of the faceplate 104. In the partially exploded view of the example system of FIG. 3, the bushings 108 are shown as being separate from the faceplate and coaxial RF connectors for explanation.

As shown in FIG. 3, when the faceplate 104 is mounted to the PCB 100 or chassis 112, the exterior surfaces of the coaxial RF connectors are not in contact with, but separate from, the interior edge of the faceplate openings 106. The diameter of the openings 106 may be greater than the outer diameter of the coaxial RF connectors. In preventing the faceplate, when mounted to the PCB, from contacting the coaxial RF connectors 102, the coaxial RF connectors may be electrically isolated from the faceplate. Electrically isolating the coaxial RF connectors from the faceplate may help to reduce the amount of noise introduced to the coaxial RF connectors, thereby improving connector performance and signal transmission. The space between the faceplate openings and the outer diameter of the coaxial RF connectors may also help to reduce EMI to the coaxial RF connectors and the coupled PCB by allowing EMI to exit through the openings 106 of the faceplate. The EMI exiting the openings of the faceplate may be from the coaxial RF connectors or other electrical components within the PCB or chassis. Allowing the EMI to exit through the openings of the faceplate reduces the amount of reflected EMI within the chassis 112 and around the PCB, thereby improving the connector and PCB performance and signal transmission.

Figure 4:
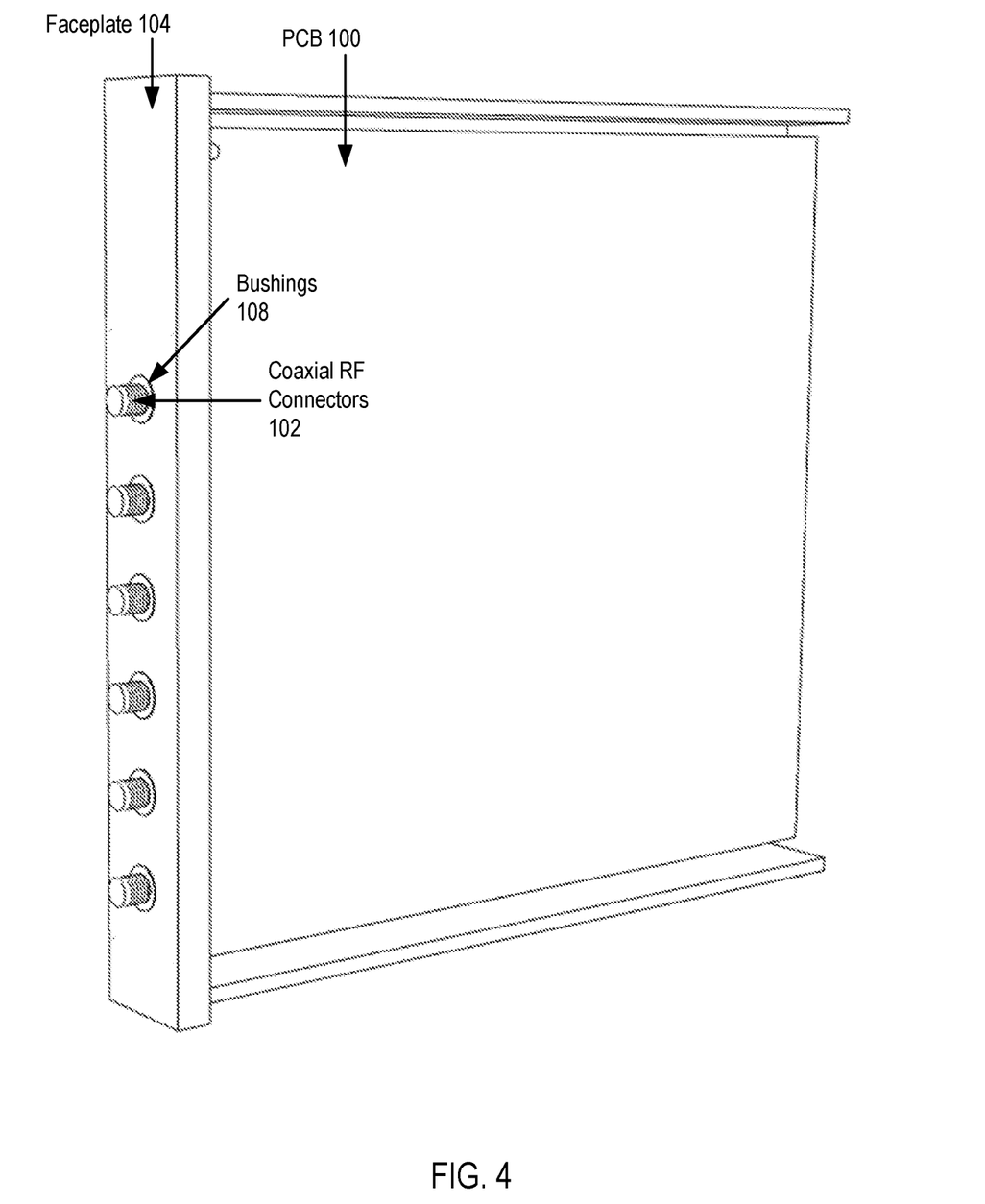
FIG. 4 shows an example line drawing of an apparatus for optimizing mounting points for coaxial RF connectors, where the apparatus is shown in an assembled configuration.

For further explanation, FIG. 4 sets forth a line drawing of the example system of FIG. 1 configured for optimizing mounting points for coaxial RF connectors according to embodiments of the present disclosure but differs from FIG. 1 in that the line drawing of FIG. 4 shows the example system in an assembled configuration. The example system of FIG. 4 shows the bushings 108 mounted to the PCB 100 with the coaxial RF connectors 102 positioned within the bushings 108. In the assembled view of the example system of FIG. 4, the bushings 108 are shown as being mounted to the PCB 100 with the coaxial RF connectors 102 positioned within the bushings 108, and the faceplate 104 is shown as being mounted to the PCB 100 with the bushings 108 positioned within the openings 106 of the faceplate 104. In she assembled view of FIG. 4, the bushings are positioned radially between the coaxial RF connectors and the edges of the faceplate openings.

As shown in FIG. 4, when both the bushings 108 and faceplate 104 are mounted to the PCB 100, the exterior surfaces of the coaxial RF connectors 102 are in contact with the interior surface of the bushings 108, and the exterior surfaces of the bushings 108 are in contact with the interior edge of the faceplate openings 106. The inner diameter of the faceplate openings 106 may be equal to the outer diameter of the bushings 108. The bushings, when mounted within the faceplate openings and to the coaxial RF connectors, may be configured to provide increased rigidity to the coaxial RF connectors and help to stabilize the coaxial RF connectors from exterior forces. When assembling the system of FIG. 4, the bushings 108 may be mounted within the faceplate openings 106 prior to mounting them to the PCB over the coaxial RF connectors, or the bushings 108 may be mounted to the coaxial RF connectors prior to mounting the faceplate to the PCB over the coaxial RF connectors and bushings.

In the example system of FIG. 4, the bushings 108 may be configured to contact both the coaxial RF connectors and the faceplate in order to stabilize the coaxial RF connectors against the faceplate, while still maintaining electrical isolation between the coaxial RF connectors and the faceplate. Electrically isolating the coaxial RF connectors from the faceplate may help to reduce the amount of noise introduced to the coaxial RF connectors, thereby improving connector performance and signal transmission. The bushings, which may be composed of a polymer material, work together with the faceplate to allow EMI to escape from the coaxial RF connectors and PCB through the faceplate openings 106, and through the bushings, while still stabilizing the coaxial RF connectors against the faceplate. Allowing the EMI to exit through the openings of the faceplate reduces the amount of reflected EMI within the chassis 112 and around the PCB, thereby improving the connector and PCB performance and signal transmission.

Figure 5:
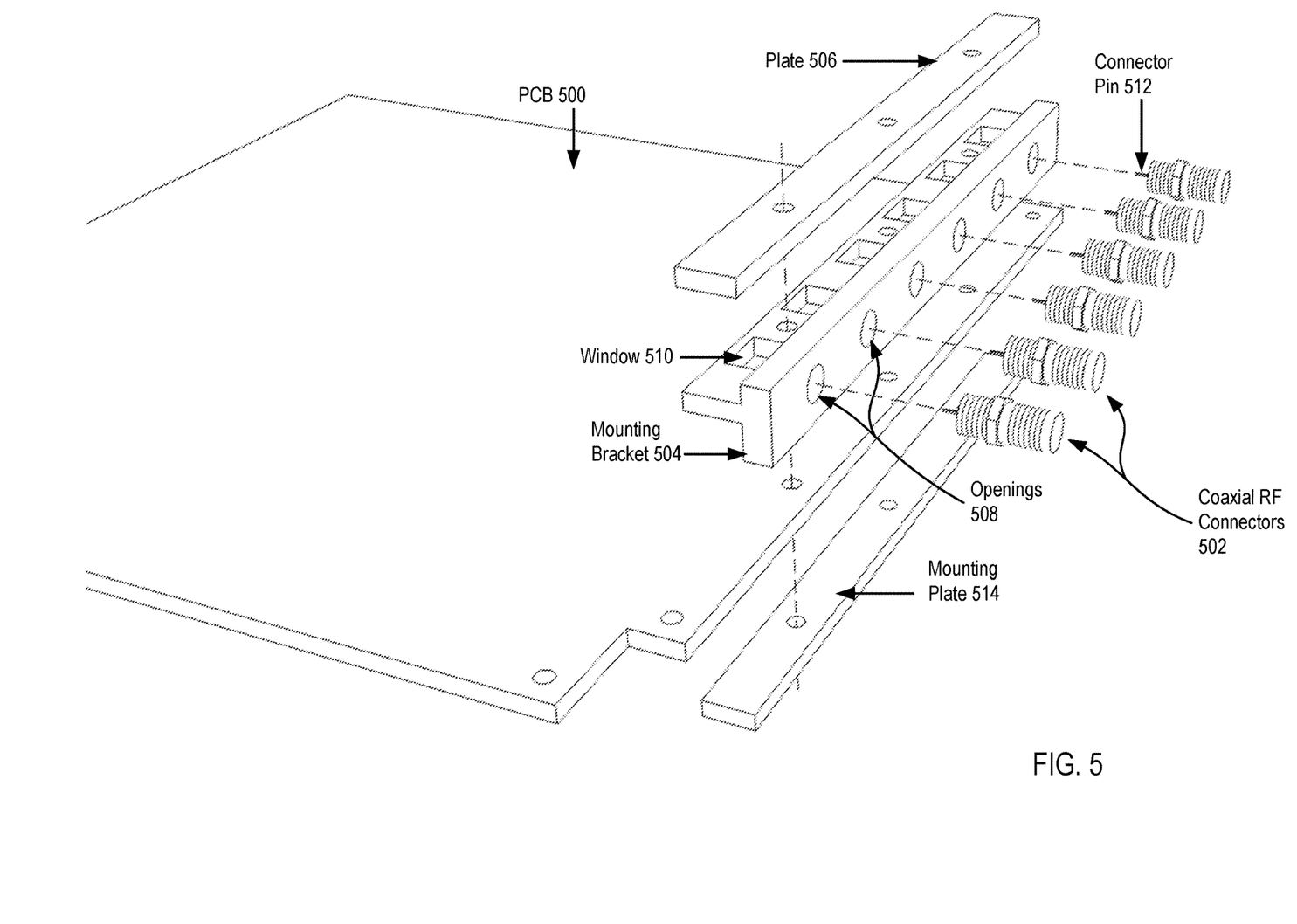
FIG. 5 shows an example line drawing of a system for optimizing mounting points for coaxial RF connectors, where the system is shown in an exploded view.

FIG. 5 sets forth a line drawing of another example system configured for optimizing mounting points for coaxial RF connectors according to embodiments of the present disclosure. The system of FIG. 5 includes a PCB 500, coaxial RF connectors 502, a mounting bracket 504, and a plate 506. The example PCB of FIG. 5 may be coupled to or mounted within a chassis (not shown in FIG. 5) and may include one or more coaxial RF connectors 502 coupled to the PCB. The example system of FIG. 5 is shown in an exploded view, with each of the PCB 500, coaxial RF connectors 502, and mounting bracket 504 shown as separate from one another for explanation.

The example coaxial RF connectors 502 of FIG. 5 may be a connector interface for a coaxial cable with a threaded coupling mechanism and may be configured to transmit radio frequency signals while maintaining the shielding properties that coaxial cables provide. The example coaxial RF connectors 502 of FIG. 5 may be SMA connectors. Those skilled in the art will understand that coaxial RF connectors are fragile and sensitive to noise and EMI. The exterior of the coaxial RF connectors 502 may be composed of metal and may include a first threaded portion operable to receive a coaxial cable and a second threaded portion operable to couple to the mounting bracket 504. The example coaxial RF connectors 502 of FIG. 5 may be configured to mount to the PCB and transmit signals between the PCB and a coaxial cable (not shown in FIG. 5). The coaxial RF connectors 502 may each include a connector pin 512. The connector pins 512 of the coaxial RF connectors 502 may be configured to electrically couple the coaxial RF connectors 502 to the PCB. The coaxial RF connectors 502 may be electrically coupled to the PCB through a soldering process that includes soldering the connector pins 512 to the PCB 500.

Figure 6:
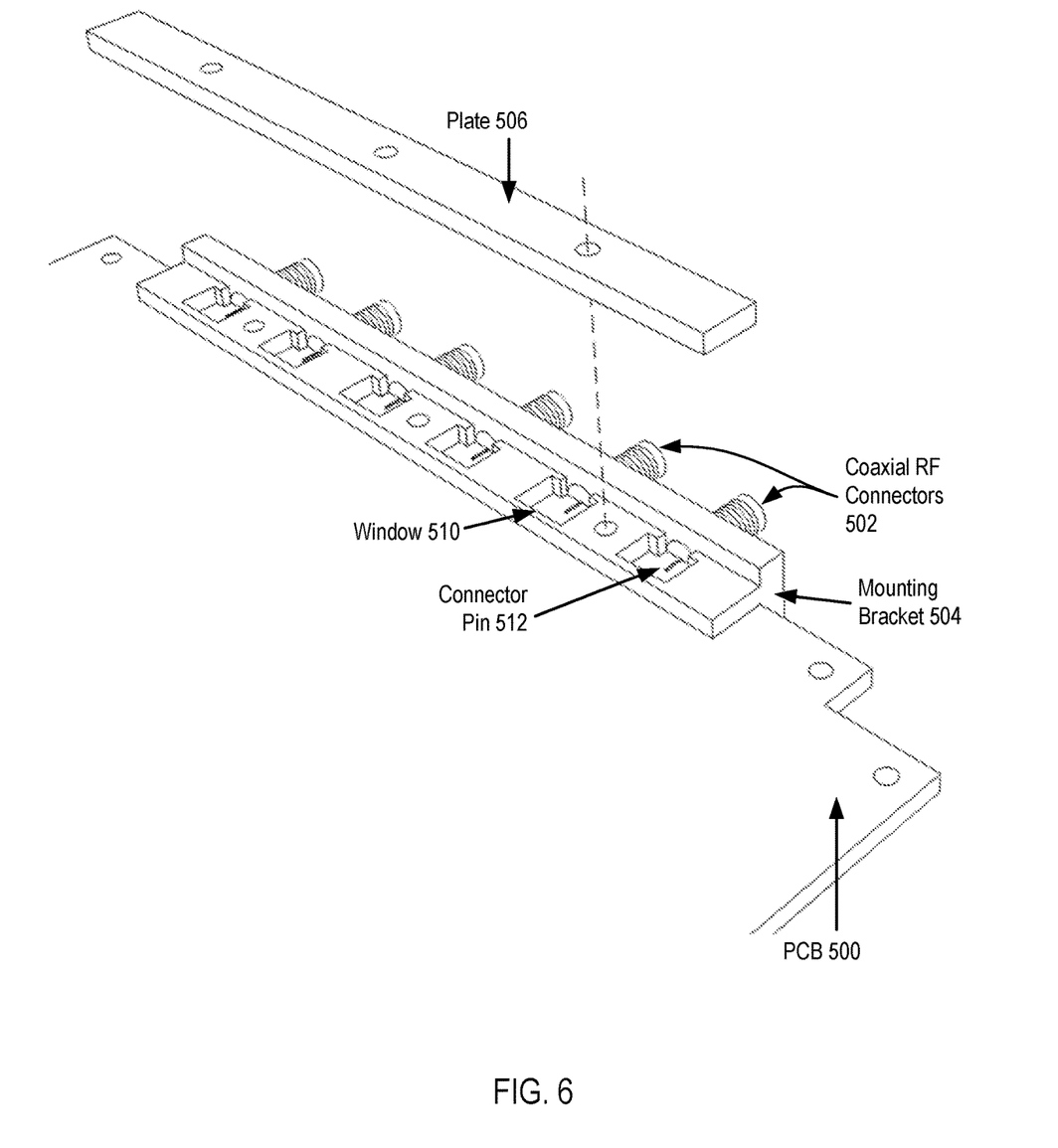
FIG. 6 shows an example line drawing of a system for optimizing mounting points for coaxial RF connectors, where the system is shown in a partially exploded view.

The example mounting bracket 504 of FIG. 5 may be configured to couple the coaxial RF connectors 502 to the PCB 500. The mounting bracket 504 of FIG. 5 may be composed of metal and may be configured to provide increased rigidity to the coaxial RF connectors 502 and help to stabilize the coaxial RF connectors from exterior forces. The mounting bracket may have a first face including openings 508 and a second face perpendicular to the first face including windows 510. The openings may be configured to receive the coaxial RF connectors 502. The openings 508 of the mounting bracket may be threaded and configured to couple to a threaded portion of the coaxial RF connectors. The windows 510 of the mounting bracket may be configured to expose a portion of the coaxial RF connectors 502 (as shown in FIG. 6). The second face of the mounting bracket including the windows may be configured to couple to a top surface of the PCB 500.

The example mounting bracket 504 of FIG. 5 may be part of a mounting bracket assembly including the mounting bracket 504 and a mounting plate 514. The mounting plate 514 may be configured to couple the PCB 500 to the mounting bracket 504. The mounting plate may be composed of a metal material. The mounting plate may be configured to mount to a surface of the PCB opposite to the surface of the PCB mounted to the mounting bracket 504. The mounting plate may be mounted to the mounting bracket with a bolt (not shown in FIG. 5) running through the PCB. The mounting bracket may mount directly to the PCB without the mounting plate. The mounting plate may increase the rigidity of the mounting bracket when mounted to the PCB.

The example plate 506 of FIG. 5 may be configured to mount to the second face of the mounting bracket 504 that includes the windows 510. The plate 506, when mounted on the mounting bracket, may be positioned over the windows 510 (as shown in FIG. 6). The plate may be mounted to the mounting bracket independent of whether the mounting bracket is mounted to the PCB 500.

For further explanation, FIG. 6 sets forth a line drawing of the example system of FIG. 5 configured for optimizing mounting points for coaxial RF connectors according to embodiments of the present disclosure but differs from FIG. 5 in that the line drawing of FIG. 6 shows the example system in only a partially exploded view. The example system of FIG. 6 shows the mounting bracket 504 mounted to the PCB 500, and also shows the coaxial RF connectors 502 mounted within the mounting bracket and coupled to the PCB. As shown in FIG. 6, when the coaxial RF connectors 502 are mounted within the mounting bracket 504, and when the mounting bracket is mounted on the PCB, the mounting bracket is configured to couple the coaxial RF connectors to the PCB. For example, the mounting bracket is configured to position the coaxial RF connectors 502 in such a way that the connector pins 512 may be electrically coupled to the PCB 500. Also shown in FIG. 6, the windows 510 of the mounting bracket 504 are configured to expose the connector pins 512 of the coaxial RF connectors 502. Exposing the connector pins of the coaxial RF connectors allows for soldering the connector pins to the PCB, thereby electrically coupling the coaxial RF connectors to the PCB.

Figure 7:
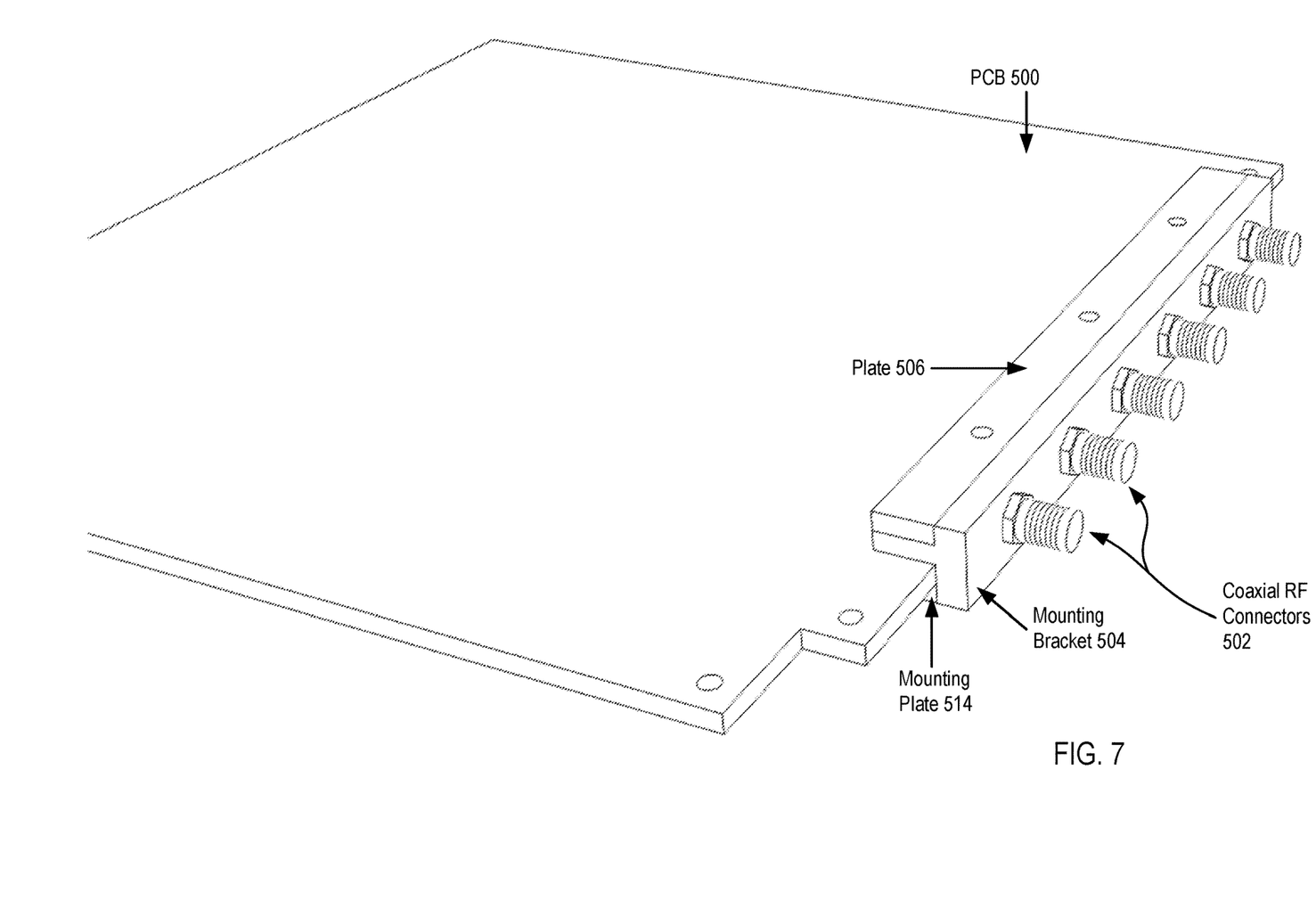
FIG. 7 shows an example line drawing of a system for optimizing mounting points for coaxial RF connectors, where the system is shown in an assembled configuration.

For further explanation, FIG. 7 sets forth a line drawing of the example system of FIG. 5 configured for optimizing mounting points for coaxial RF connectors according to embodiments of the present disclosure but differs from FIG. 5 in that the line drawing of FIG. 7 shows the example system in an assembled configuration. The example system of FIG. 7 shows the plate 506 mounted onto the mounting bracket 504, which is in turn mounted to the PCB and coupling the coaxial RF connectors 502 to the PCB. In the assembled view of the example system of FIG. 7, the plate 506 is positioned on the mounting bracket such that the plate covers the windows 510 of the mounting bracket. The mounting plate, if utilized to strengthen the mounting bracket 504, is positioned beneath the PCB, on the opposite side as the mounting bracket, and coupled to the mounting bracket.

The example plate 506, when mounted on the mounting bracket 504, is configured to cover the exposed connectors pins 512 of the coaxial RF connectors 502. The plate 506 may be composed of a metal material. When mounted on the mounting bracket, the plate 506, being composed of metal, is configured to shield the connector pins from outside forces while also preventing EMI coming from electrical components of the PCB or external RF (radio frequency) signals from interfering with the connector pins 512, thereby improving connector performance.

The example plate 506 of FIG. 7 may be mounted from above the mounting bracket 504 using connectors (not shown in FIG. 7), such as screws, bolts, or the like. Alternatively, the plate may be mounted to the mounting bracket by sliding the plate into position from the side of the PCB, using tabs (not shown in FIG. 7) mounted on the mounting bracket or PCB. The plate may be mounted to the mounting bracket after the mounting bracket is mounted to the PCB and electrically coupling the coaxial RF connectors 502 to the PCB 500. The plate 506 may be removable to allow the connector pins to be exposed when needed, such as for repair, disassembly, or the like. The plate 506 may be interchangeable with a different plate, such as one of a different thickness, material composition, or the like, in order to change the affect of EMI shielding. For example, increasing the thickness of the plate may better shield the connector pins 512 from potentially interfering EMI.

In view of the explanations set forth above, readers will recognize that the benefits of optimizing mounting points for coaxial RF connectors according to embodiments of the present disclosure include:

Electrically isolating the coaxial RF connectors while stabilizing the coaxial RF connectors to the PCB.

Reducing the amount of reflected EMI around the coaxial RF connectors and PCB while stabilizing the coaxial RF connectors to the PCB.

Optimizing the connections between coaxial RF connectors and PCBs to reduce connector noise and interference while maintaining sufficient protection to the connectors.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. An apparatus comprising:
 a mounting bracket comprising a plurality of openings, wherein the mounting bracket is configured to couple a plurality of coaxial RF connectors to a PCB, wherein the mounting bracket further comprises a plurality of windows configured to expose a plurality of connector pins of the plurality of coaxial RF connectors, and wherein the mounting bracket fully surrounds each of the plurality of connector pins; and
 a plate positioned over the mounting bracket and configured to cover a portion of each of the plurality of coaxial RF connectors.

2. The apparatus of claim 1, wherein the plate comprises a metal material.

3. The apparatus of claim 1, wherein the mounting bracket comprises a metal material.

4. The apparatus of claim 1, wherein each the plurality of openings is coupled to a threaded portion of the plurality of coaxial RF connectors.

5. The apparatus of claim 1, wherein the plate does not extend past the mounting bracket.

6. The apparatus of claim 1, wherein the plate is configured to cover a plurality of connector pins of the plurality of coaxial RF connectors.

7. The apparatus of claim 1, wherein the mounting bracket is included in a mounting bracket assembly comprising the mounting bracket and a mounting plate, wherein the mounting plate is configured to couple the mounting bracket to the PCB.

8. A system comprising:
 a printed circuit board (PCB);
 a plurality of coaxial radio frequency (RF) connectors coupled to the PCB with a mounting bracket,
 wherein the mounting bracket comprises a first face comprising a plurality of openings configured to couple to the plurality of coaxial RF connectors;
 wherein the mounting bracket further comprises a second face coupled to the PCB and configured to expose a plurality of connector pins of the plurality of coaxial RF connectors, and wherein the mounting bracket fully surrounds each of the plurality of connector pins; and
 a plate positioned over the mounting bracket and covering a portion of each of the plurality of coaxial RF connectors.

9. The system of claim 8, wherein the plate comprises a metal material.

10. The system of claim 8, wherein the mounting bracket comprises a metal material.

11. The system of claim 8, wherein the plurality of openings are coupled to a threaded portion of the coaxial RF connectors.

12. The system of claim 8, wherein the plate does not extend past the mounting bracket.

13. The system of claim 8, wherein the plate covers a plurality of connector pins of the plurality of coaxial RF connectors.

14. The system of claim 8, wherein the mounting bracket is included in a mounting bracket assembly comprising the mounting bracket and a mounting plate, wherein the PCB is positioned between the mounting plate and the mounting bracket.

* * * * *